United States Patent [19]

Burns et al.

[11] Patent Number: 4,965,692
[45] Date of Patent: Oct. 23, 1990

[54] OVERLOAD DETECTOR AND PROTECTION CIRCUIT

[75] Inventors: Robert V. Burns; Sanjay Gupta, both of Phoenix, Ariz.

[73] Assignee: Siemens Transmission Systems, Inc., Phoenix, Ariz.

[21] Appl. No.: 387,194

[22] Filed: Jul. 31, 1989

[51] Int. Cl.⁵ .......................................... H02H 7/122
[52] U.S. Cl. ........................................ 361/18; 361/75; 363/55
[58] Field of Search ................. 361/18, 42, 74, 75, 361/86, 91, 56, 58, 111; 363/50, 55

[56] References Cited

U.S. PATENT DOCUMENTS

| | | |
|---|---|---|
| 4,254,305 | 3/1981 | Treiber . |
| 4,288,831 | 9/1981 | Dolikian ........................... 363/50 X |
| 4,438,473 | 3/1984 | Cawley et al. ......................... 361/74 |
| 4,476,427 | 10/1984 | Kaneko et al. ....................... 363/55 |
| 4,656,659 | 4/1987 | Chea, Jr. ............................. 379/253 |
| 4,878,034 | 10/1989 | Grogg et al. ......................... 361/75 |

Primary Examiner—Todd E. DeBoer
Attorney, Agent, or Firm—Jeffrey P. Morris

[57] ABSTRACT

An overload protection circuit for power supplies and telecommunications apparatus such as multifrequency ringing generators causes the output voltage to become zero when a current overload is detected. The voltage is kept at zero for a predetermined period of time. Then the output voltage is restored. If an overload is still detected, the output voltage is again brought to zero.

5 Claims, 3 Drawing Sheets

CURRENT FOLDBACK
(PRIOR ART)

CURRENT LIMITING
(PRIOR ART)

OUTPUT OF POWER AMPLIFIERS
UNDER NORMAL OPERATION

OUTPUT OF POWER AMPLIFIERS
UNDER SHORT CIRCUIT PROTECTION 1

OUTPUT OF POWER AMPLIFIERS
UNDER SHORT CIRCUIT PROTECTION 2

OVERLOAD DETECTOR AND PROTECTION CIRCUIT

BACKGROUND OF THE INVENTION

1. Field of the Invention

The present invention relates to short circuit protection circuitry for power supplies or power units of telecommunications or data handling apparatus. The invention is particularly applicable to ringing generators, multifrequency ringing generators for telecommunications applications and to power supplies.

2. Description of the Prior Art

Power supplies, telephone ringing generators or any other electrical apparatus which utilizes high voltage and current must be protected against a short circuit placed across its output terminals. One such apparatus requiring such short circuit protection is a telephone ringing generator which typically utilizes −48Vdc and includes means for converting this voltage to a low frequency sinewave of 20 HZ at 100 Vrms. If such apparatus did not have such short circuit protection, it would try to draw an infinite amount of current under this stressful load. In accordance with the known prior art, a self-protection technique is initiated after the output current exceeds a certain threshold.

Presently, there are two well known and widely used techniques for protecting a ringing generator against a short circuit. The first such short circuit protection technique is shown in FIG. 1 and is referred to as Current Limiting. In accordance with this self-protection method, the voltage decreases in order to maintain a constant output current as the impedance of the load approaches zero. During this period of protection, the output of the protected apparatus is no longer in an acceptable region of usage and tremendous energy is expended. The apparatus will return to normal operation only if the impedance of the load returns to a value which is above a fixed threshold.

The second well known prior art short circuit protection technique is shown in FIG. 2, whereby the amount of energy expended under current limiting is reduced. This self-protection scheme is known as current foldback, and it reduces the short circuit current to a fraction of the full load output current. As in the case of current limiting, during the protection period the output of the protected apparatus is no longer in an acceptable region of usage, but considerably less energy is expended. The major problem with this known technique is that for the apparatus to return to normal operation the load must be removed from the output.

An example of a well known telecommunications ring signal generator of the multifrequency type is illustrated by U.S. Pat. No. 4,656,659. An example of a well known current limited subscriber line feed circuit is illustrated by U.S. Pat. No. 4,254,305.

SUMMARY OF THE INVENTION

In accordance with the present invention, a short circuit protection circuit for power units is described, whereby the dc current fed into the power amplifier stages is sensed for an instantaneous response. When this input dc current rises above a predetermined threshold, the output of the power unit is brought down to zero for a fixed period of time. Then, the output of the power unit is regenerated, but if the load is still drawing too much current, e.g. if the load current still exceeds the predetermined threshold, the output is again turned off. This operation continues in a cyclic manner until the load no longer draws excessive current. The described invention also advantageously reduces the energy expended under short circuit conditions, and causes the power unit to return to normal operation when the load is greater than the predetermined threshold. Under conditions of short circuit protection, presently known prior art techniques control the voltage to maintain a particular constant current. In maintaining a constant current, valuable energy is wasted because the voltage is reduced to a value below the nominal. In contradistinction and in accordance with the present invention, a novel circuit is described that completely shuts off the output of the power unit for a fixed period of time under short circuit conditions. After this fixed time period has elapsed, the output is restarted, and then the instant the output draws more than a predetermined amount of current, it is shut off again.

It is therefore a primary object of the present invention to provide short circuit protection for power units wherein the dc current fed into the power stages is sensed for an instantaneous response. When the sensed current rises above a predetermined threshold, the output of the power unit is brought down to zero for a fixed time period, after which the output is again regenerated. However, if the load is still drawing too much current, the output is again turned off. This operation continues in a cyclic manner until the load no longer draws excessive current.

Other objects and advantages of the present invention will become apparent to one skilled in the art from the following detailed description of a preferred embodiment taken together with the drawings appended hereto.

DESCRIPTION OF THE PREFERRED EMBODIMENT

Figure 2:
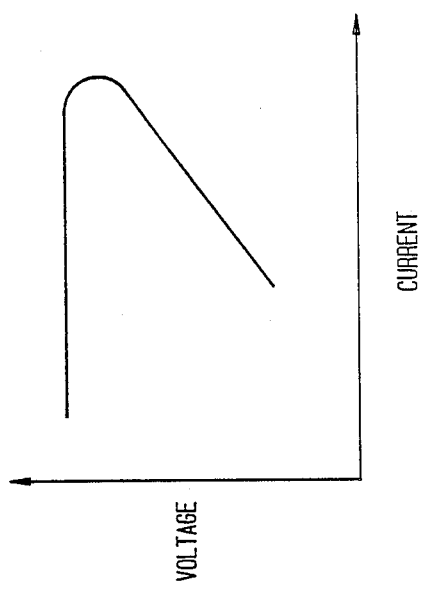
FIG. 2 is a graph illustrative of the relationship of short circuit current vs. full load output current in accordance with prior art current foldback techniques.
Figure 1:
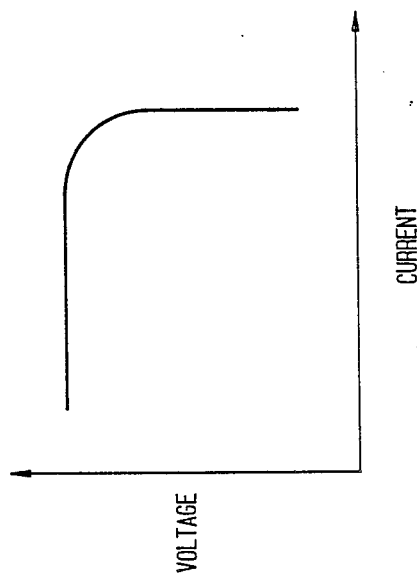
FIG. 1 is a graph illustrative of the relationship of voltage vs. output current in accordance with prior art current limiting techniques.
Figure 3:
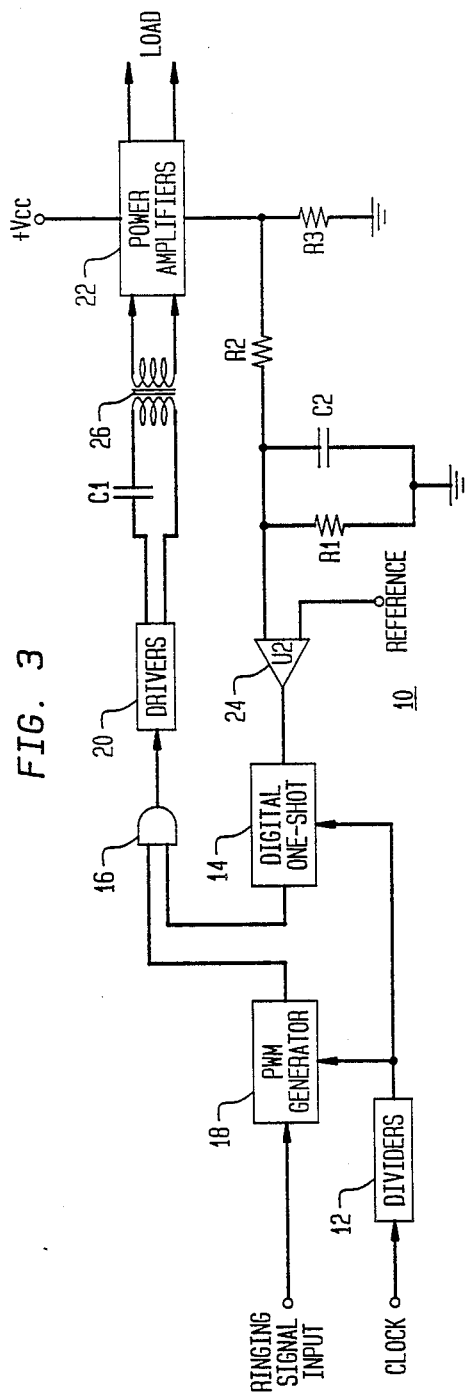
FIG. 3 is a block diagram of an overload detection circuit in accordance with the present invention.

An overload detection circuit is shown generally at 10 with reference to FIG. 3. An incoming clock is coupled via a divider circuit 12 to a digital one-shot multivibrator 14. Under normal operating conditions, the digital one-shot 14 places a logic high at the input of an AND gate shown at 16. In this mode, AND gate 16 passes the pulse width modulated ringing signals derived from a ringing signal generator of well known design from the PWM generator 18 to the drivers 20, and a ringing signal is outputted by the power amplifiers 22 unit.

The resistors $R_1$, $R_2$, and $R_3$, capacitor $C_2$ and comparator 24 are used to sense the dc current. The resistor $R_3$ which is preferably a few ohms, senses the dc current coupled to the power amplifiers 22 via transformer 26.

By sensing the dc current an instantaneous shut down of the ringing generator is assured. The voltage developed across resistance $R_3$ is filtered and scaled down through resistances $R_1$, $R_2$, and capacitor $C_2$. This filtered and scaled signal is compared against a reference voltage at the input of comparator 24. Under normal operation (non short-circuit conditions) the difference of the two input voltages to comparator 24 places a logic low at the input of the digital one-shot 14. However, as the voltage difference at the input of comparator 24 changes polarity, the output of comparator 24 goes logic high and initiates the one-shot 14. The clock input is used to control the timing of the one-shot 14 so that the period of shut down is fixed.

Figure 4A:
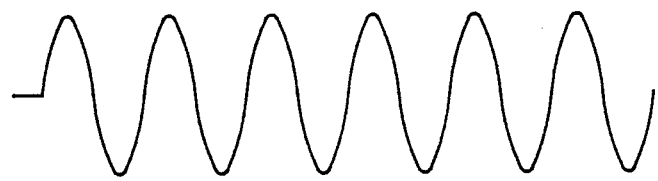
FIGS. 4(a), 4(b) and 4(c) are waveform diagrams illustrative of the output of a power amplifier incorporating the present invention under various operating conditions.
Figure 4B:
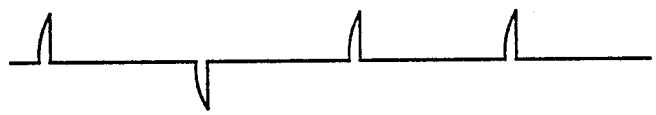
Figure 4C:

During shut-down a logic low is placed at the input of AND gate 16. This turns off the drive signals. In the shut-down mode, no current is drawn through resistance $R_3$ and the output of comparator 24 is reset to a logic low. If the load on the power amplifiers still draws an excessive amount of current after the one-shot 14 has timed out, the output of the PWM generator 18 will again be turned off. This cyclic mode is illustrated by the waveform diagrams of FIG. 4. FIG. 4(a) illustrates normal load conditions. In FIG. 4(b), the output (the load across power amplifiers 22), is shown to be in a first short circuit protection mode due to the operation of the overload detection circuit 10. This condition is caused by the load drawing approximately twenty percent more current than the PWM generator 18 can supply. The output of the PWM generator 18 in FIG. 4(b) tries to supply the load with the desired signal, but the instant the load draws too much current the output is turned off. FIG. 4(c) illustrates the condition where the load is drawing approximately sixty percent more current than the generator can supply. The energy expenditure in both short circuit protection examples is minimized.

While the present invention has been described in connection with a preferred embodiment thereof, it is to be understood that additional embodiments, modifications and applications which will become obvious to those skilled in the art are included within the spirit and scope of the invention as set forth in the claims appended hereto.

We claim:

1. A power unit having overload protection, comprising:
   an input section for providing a digital power input signal representing a power output to be supplied to a load;
   an AND gate having one input to which said digital power input signal is applied, another input to which a digital power enable signal is applied, and an output for providing a digital power output signal when both said digital power input signal and said digital power enable signal are applied at a "high" logic level;
   a power amplifier stage for providing a power output to a load in response to said digital power output signal from said AND gate;
   sensing means for sensing a current level corresponding to the power output of said power amplifier stage, and for producing a current level voltage based thereon;
   a comparator for comparing said current level voltage with a reference voltage representing a predetermined safe current level, and for producing an output indicative of when the current level of the power output exceeds the predetermined safe current level;
   digital timing-out means having an input coupled to the output of said comparator, and having an output for normally providing the digital power enable signal at a "high" logic level to said AND gate and for providing the digital power enable signal at a "low" logic level to said AND gate for a predetermined period of time when the output of said comparator indicates that the current level of the power output has exceeded the predetermined safe current level.

2. A power unit according to claim 1, which is a ringing signal generator, wherein said input section includes a pulse width modulation (PWM) generator for providing digital pulse width modulated signals representing a ringing signal output to be supplied to the load, and said power amplifier stage includes a driver and a transformer for converting the digital pulse width modulated signals passed by said AND gate to a ringing signal.

3. A power unit according to claim 1, wherein said digital timing-out means is a one-shot multivibrator having an input clock to control its timing to set the predetermined period of time during which said digital power enable signal is shut-down at the "low" logic level.

4. A method of protecting a power unit from an overload condition, comprising the steps of:
   providing a digital power input signal representing a power output to be supplied to a load;
   gating said digital power input signal through an AND gate with a digital power enable signal, and providing an output of a digital power output signal when both said digital power input signal and said digital power enable signal are at a "high" logic level;
   amplifying the digital power output signal from the AND gate as a power output to a load;
   sensing a current level corresponding to the power output and producing a current level voltage based thereon;
   comparing the current level voltage with a reference voltage representing a predetermined safe current level, and producing an output indicative of when the current level of the power output exceeds the predetermined safe current level; and
   normally providing the digital power enable signal at a "high" logic level to the AND gate, and providing the digital power enable signal at a "low" logic level to the AND gate for a predetermined period of time when the current level of the power output has exceeded the predetermined safe current level.

5. A method of protecting a power unit according to claim 4, wherein the overload condition is a short circuit condition.

* * * * *